(12) United States Patent
Gan et al.

(10) Patent No.: US 7,696,064 B2
(45) Date of Patent: Apr. 13, 2010

(54) METHODS FOR FORMING A THROUGH VIA

(75) Inventors: Qing Gan, Fremont, CA (US); Anthony LoBianco, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 11/870,624

(22) Filed: Oct. 11, 2007

(65) Prior Publication Data

US 2009/0098731 A1  Apr. 16, 2009

(51) Int. Cl.
  *H01L 21/46* (2006.01)
  *H01L 21/302* (2006.01)
(52) U.S. Cl. .................. 438/456; 438/459; 438/690; 257/E23.174
(58) Field of Classification Search ......... 438/455–459, 438/602, 618–651, 690–692; 257/E23.174
  See application file for complete search history.

(56) References Cited

U.S. PATENT DOCUMENTS

| 7,026,223 | B2 * | 4/2006 | Goodrich et al. ............ 438/456 |
|---|---|---|---|
| 7,344,959 | B1 * | 3/2008 | Pogge et al. ................. 438/459 |
| 2004/0191957 | A1 * | 9/2004 | Chen et al. .................. 438/110 |
| 2004/0259325 | A1 * | 12/2004 | Gan ........................... 438/456 |
| 2005/0003575 | A1 * | 1/2005 | Tan et al. ..................... 438/106 |
| 2006/0019490 | A1 * | 1/2006 | Chou et al. .................. 438/637 |
| 2006/0141760 | A1 * | 6/2006 | Brandl et al. ................ 438/612 |
| 2006/0216857 | A1 |  9/2006 | Zhao |
| 2006/0223301 | A1 * | 10/2006 | Vanhaelemeersch et al. 438/618 |
| 2007/0176250 | A1 |  8/2007 | Lee et al. |
| 2007/0238262 | A1 * | 10/2007 | Summers .................... 438/455 |
| 2007/0284602 | A1 * | 12/2007 | Chitnis et al. ................. 257/98 |

FOREIGN PATENT DOCUMENTS

JP     2005251898 A    9/2005

* cited by examiner

*Primary Examiner*—Hsien-ming Lee
*Assistant Examiner*—Kevin Parendo

(57) ABSTRACT

A through via is constructed in a two-stage process. A void in a portion of the depth of the substrate is filled from a first surface of the semiconductor substrate creating an enclosed volume within the substrate. Thereafter, the enclosed volume is exposed and the remaining portion of the void is filled.

13 Claims, 11 Drawing Sheets

METHODS FOR FORMING A THROUGH VIA

BACKGROUND

The present invention is generally directed to the field of semiconductor manufacturing, and, more particularly, to various methods for forming conductive through-wafer vias and for forming stacked packages.

Integrated circuit technology relies on transistors to formulate vast arrays of functional circuits. The complexity of these circuits requires the use of an ever-increasing number of linked transistors. As the number of transistors increases, the integrated circuitry dimensions shrink. One challenge in the semiconductor industry is to develop improved methods for electrically connecting and packaging circuit devices which are fabricated on the same and on different integrated circuit dies or chips. In general, it is desirable in the semiconductor industry to construct circuits which occupy less surface area on the silicon chip/die.

As integrated circuit technology progresses, there is a growing desire for a "system on a chip." Ideally, a computing system would be fabricated with all the necessary integrated circuits on one wafer, as compared with today's method of fabricating many chips of different functions and packaging them to assemble a complete system. Such a structure would greatly improve integrated circuit performance and provide higher bandwidth. In practice, it is very difficult with today's technology to implement a high-performance "system on a chip" because of vastly different fabrication processes and different manufacturing yields for the various logic and memory circuits.

As a result, there are economic advantages associated with forming a module or system from an interconnected group of different types of previously-tested integrated circuits. One way of connecting circuit elements at the interface of a module or integrated circuit is to form an electrically conductive via or passage through a wafer or die.

For these applications, a metal filled void-free through via is desired. The conventional fill process is to plate metal into the via. To achieve a complete void-free via, bottom up plating is a typical approach. However, such bottom up plating is difficult. First, due to the high aspect ratio of the via, the diffusion of metal ions from a plating solution to the bottom of the via results in a slow fill rate. Second, plating thickness is not uniform with the layer near the bottom of the via being much thinner than the layer at the opening of the via. The application of a higher plating current density only exacerbates the problem as the significantly higher deposit rate at the via opening results in metal filling the upper portion of the via before the bottom of the via can be filled. Plating chemistry has been modified in an attempt to accomplish a void-free via. These attempts include additives to suppress plating at the opening of the via and additives to accelerate the diffusion of ions into the via. A suitable plating chemistry has not been identified. The application of a low current density for current (DC) plating or pulse and reverse-pulse plating techniques have been used to completely fill a via. Unfortunately, these process techniques are time consuming taking from hours for relatively small volume vias to days for larger vias.

Consequently, successful and efficient methods of forming conductive void free through-wafer vias are desired.

SUMMARY

One embodiment of a method for forming a through via includes the steps of forming a void through a portion of a semiconductor substrate from a first surface of the semiconductor substrate, filling the upper portion of the void to generate an enclosed volume within the semiconductor substrate, exposing the enclosed volume and filling the remaining portion of the void.

One embodiment of a method for manufacturing a package includes the steps of forming a void through a portion of a semiconductor substrate from a first surface of the semiconductor substrate, filling a first portion of the void from the first surface of the semiconductor substrate to generate an enclosed volume within the semiconductor substrate, applying a bond layer on the first surface of the semiconductor over the enclosed volume, bonding a wafer to the semiconductor substrate using the bond layer, exposing the enclosed volume from a second surface of the semiconductor substrate opposed to the first surface, and filling the remaining portion of the void.

The figures and detailed description that follow are not exhaustive. The disclosed embodiments are illustrated and described to enable one of ordinary skill to make and use a wafer-level package using a method for forming a through via. Other embodiments, features and advantages of the method for forming a through via will be or will become apparent to those skilled in the art upon examination of the following figures and detailed description. All such additional embodiments, features and advantages are within the scope of the wafer-level package and methods for forming a through via as defined in the accompanying claims.

BRIEF DESCRIPTION OF THE FIGURES

The methods for forming through via can be better understood with reference to the following figures. The components within the figures are not necessarily to scale, emphasis instead being placed upon clearly illustrating the methods for forming a via. Moreover, in the figures, like reference numerals designate corresponding parts throughout the different views.

DETAILED DESCRIPTION

A through via is constructed in a two-stage process. In a first stage, a void in a portion of the depth of a semiconductor substrate is filled from a first surface of the substrate creating an enclosed volume within the substrate. In a second stage, the enclosed volume is exposed and the remaining portion of the void is filled.

In the disclosed two-stage plating process, the diffusion rate is either not important (e.g., in first stage) or is enhanced by a reduced aspect ratio (e.g., in the second stage). In addition, the plating current density at the bottom of the via is either irrelevant (e.g., in the first stage) or significantly improved (e.g., in the second stage). Consequently, significantly larger plating current densities can be applied to enhance plating throughput and decrease the time required to fill a through via.

Although described with particular reference to forming a metal filled (i.e., void free) via for a wafer-level package, specifically for wafer bonding in a three-dimensional stacked package, the present methods for forming a through via can be applied to a wide range of applications and semiconductor device manufacturing processes. For example, the present methods for forming a through via may be used wherever a void free conductive via is desired.

By way of further example, the present methods for forming a through via can be applied during the construction of microelectromechanical systems (MEMS). MEMS integrate mechanical elements, sensors, actuators, and electronics through microfabrication technology. While the electronics are fabricated using integrated circuit (IC) process sequences (e.g., complementary metal-oxide semiconductor (CMOS), bipolar, or bipolar and CMOS (BICMOS) processes), the micromechanical components are fabricated using compatible "micromachining" processes that selectively etch away parts of the wafer or substrate or add new structural layers to form the mechanical and electromechanical devices. Because MEMS devices are manufactured using batch fabrication techniques similar to those used for integrated circuits, unprecedented levels of functionality, reliability, and sophistication can be placed on a small silicon chip at a relatively low cost.

Figure 1:
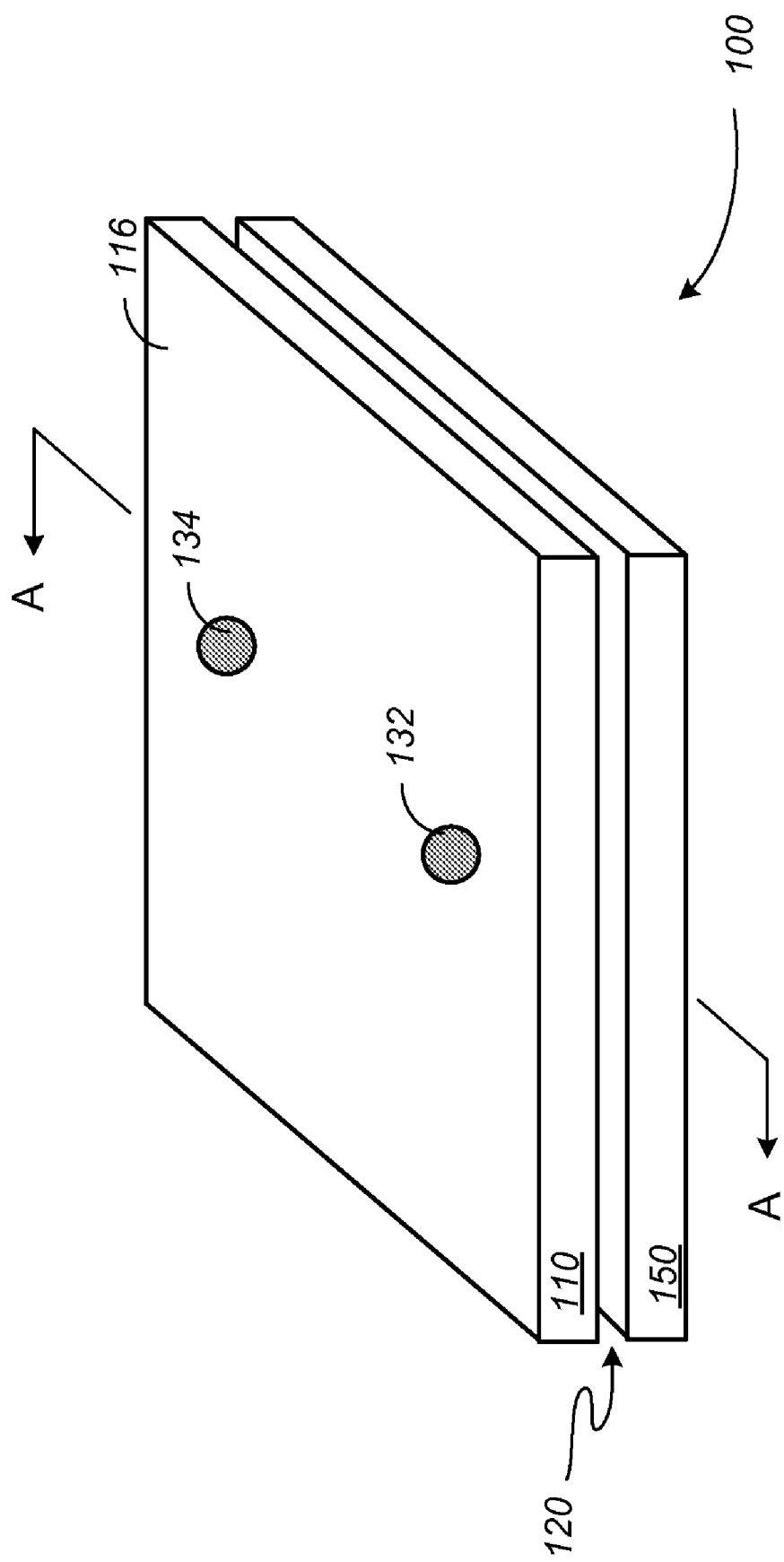
FIG. 1 is a schematic diagram illustrating an embodiment of a wafer-level package.

Turning now to the drawings, wherein like reference numerals designate corresponding parts throughout the drawings, reference is made to FIG. 1, which illustrates wafer-level package 100. Package 100 includes a semiconductor substrate 110 and a wafer 150. Wafer 150 is physically coupled to semiconductor substrate 110 via bonding layer 120, which is located between semiconductor substrate 110 and wafer 150. Semiconductor substrate 110 can be physically and electrically coupled to one or more integrated circuits, discrete circuit elements or other devices via solder bumps on surface 116. For simplicity of illustration, the embodiment illustrated in FIG. 1 includes two solder bumps, solder bump 132 and solder bump 134. In other embodiments, surface 116 will comprise additional solder bumps as may be desired.

Figure 2:
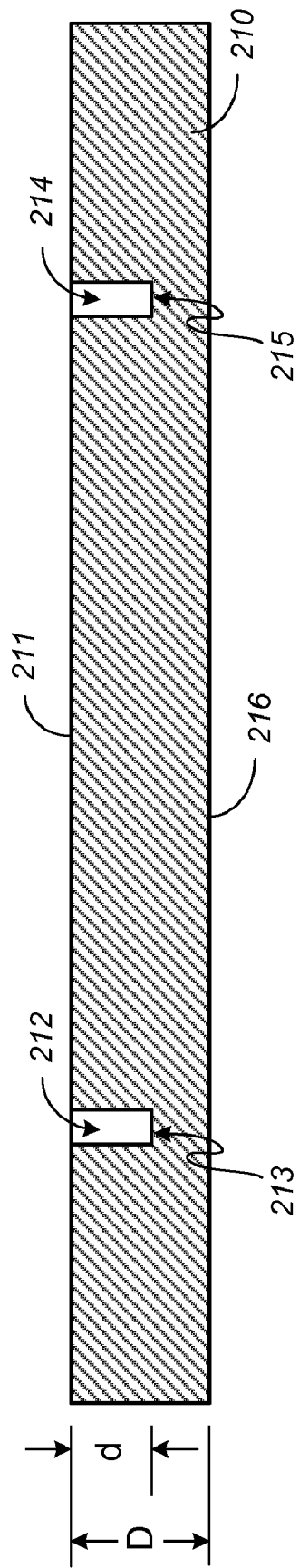
FIG. 2 is a schematic diagram illustrating a cross-sectional view of an embodiment of the semiconductor substrate of FIG. 1.

FIG. 2 is a schematic diagram illustrating a cross-sectional view of an embodiment of the semiconductor substrate 110 of FIG. 1 along line A-A. As shown in FIG. 2, semiconductor substrate 210 is defined by a first surface 211 and an opposing surface 216 that are separated from each other by distance, D. Semiconductor substrate 210 includes void 212, which is defined by a lowermost surface 213 and void 214, which is defined by a respective lowermost surface 215. Each of void 212 and void 214 can be formed using one or more processes such as deep reactive ion etching, reactive ion etching, drilling and other techniques. When a void or voids are formed by drilling, a laser or micromechanical bit can be used to remove material from semiconductor substrate 210. In the illustrated embodiment, void 212 and void 214 each start at first surface 211 and extend into the semiconductor substrate 210 in the direction of opposing surface 216 a distance, d, which is shorter in length than distance D. In some embodiments, void 212 and void 214 each have an opening with a diameter in the range of 5 to 100 micrometers and a depth in the range of 30 to 200 micrometers.

Figure 3:
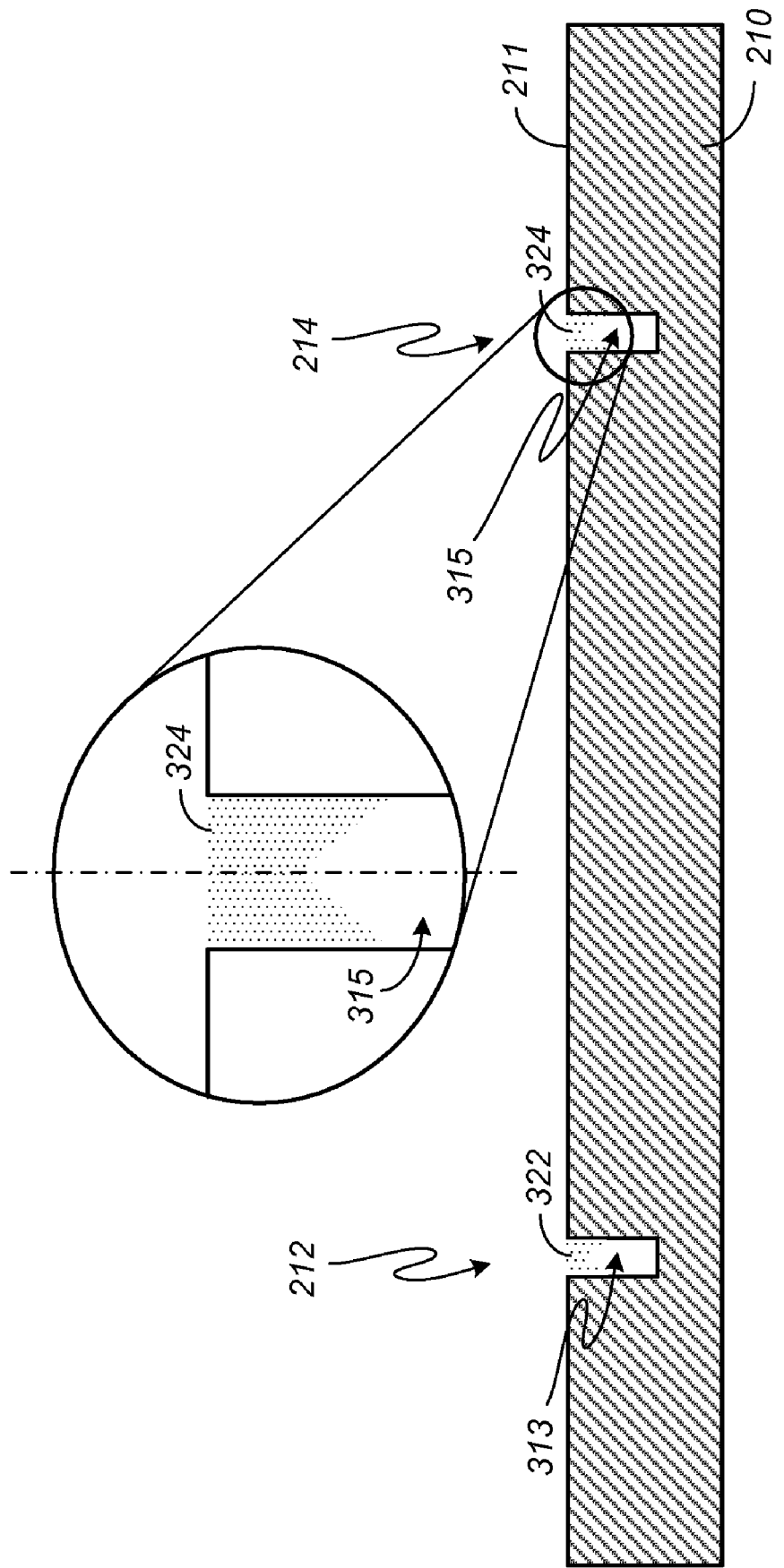
FIG. 3 is a schematic diagram illustrating an embodiment of the semiconductor substrate of FIG. 2 where a seed layer is deposited to partially fill an upper portion of a via.

FIG. 3 is a schematic diagram illustrating the semiconductor substrate of FIG. 2 where void 212 and void 214 have been partially filled. Void 212 and void 214 are partially filled with a conductive material 322 and conductive material 324 to create enclosed volume 313 and enclosed volume 315, respectively, within semiconductor substrate 210. The process of filling the upper portion of the voids or more accurately filling partially each of void 212 and void 214 from an opening in first surface 211, as shown in FIG. 3, can be performed with or without a seed layer. When a seed layer is desired, the seed layer may be deposited or otherwise applied to the side or vertical surfaces within the void. The seed layer (not shown) may comprise any material that accepts or accelerates the acceptance of atoms or ions of an electrically conductive material on the treated surfaces of the void. In some embodiments, the conductive material comprises one or more of copper, nickel, or solder, which are plated or applied using a plating process such as electroplating to fill the void partially. Electroplating is the process by which a metal in its ionic form is supplied with electrons to form a non-ionic coating on a desired substrate. The most common system involves: a chemical solution which contains the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal. Electroless plating is an alternative technique that may be used to fill the voids partially. Other possible techniques include thin-film deposition, vapor deposition, sputter deposition, as well as methods using vacuum conditions or gas for seed layer deposition. Whichever plating process is selected will generally result with a build-up of fill material that reaches deeper into the respective void along the vertical sidewalls. Once the buildup at the opening of the respective void fills the opening, the plating process can be stopped as continued plating will result in the buildup of excess fill material in the respective regions above the void.

As shown in FIG. 3, semiconductor substrate 210 includes fill material 322 in a portion of void 212. Similarly, fill material 324 fills a portion of void 214. The combination of fill material 322 and the surfaces surrounding void 212 define enclosed volume 313. Similarly, the combination of fill material 324 and the surfaces surrounding void 214 define enclosed volume 315. When a mechanical drill or laser is applied at a defined location to create a void having a circular area at the opening in surface 211, the resulting enclosed volume will include a lower portion that resembles a cylinder and an upper portion that resembles a cone. When a void is created by moving one or both of the substrate and the material removal mechanism relative to each other, the void may take any number of shapes other than a circle at the opening. When a non-circular opening is created, the resulting enclosed volume will have corresponding lower and upper portions with three-dimensional shapes other than a cylinder and a cone.

Figure 4:
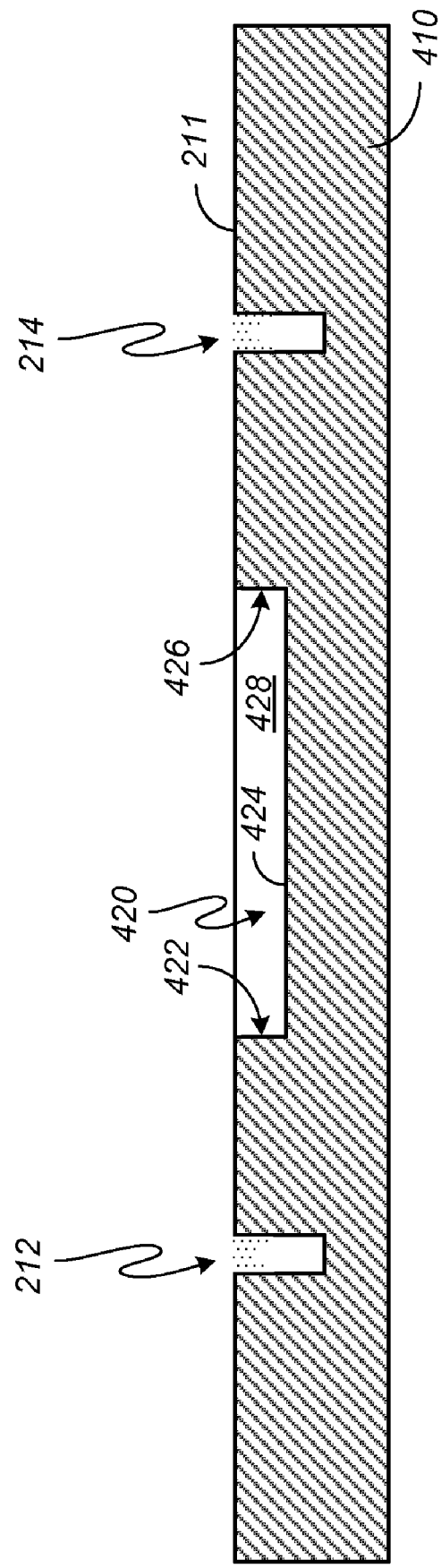
FIG. 4 is a schematic diagram illustrating an embodiment of the semiconductor substrate of FIG. 3 where a cavity has been formed.

FIG. 4 is a schematic diagram illustrating the semiconductor substrate 210 of FIG. 3 where a cavity has been formed. A recess or cavity 420 is formed using one or more of deep reactive ion etching (DRIE), reactive ion etching (RIE), chemical etching, mechanical etching, or other techniques in a select area of the first surface 211. As illustrated in FIG. 4, semiconductor substrate 410 includes cavity 420, which is defined by left-side surface 422, lower surface 424 and right-side surface 426. When cavity 420 is formed using a pattern or opening that is rectangular, as shown in the illustrated embodiment, cavity 420 is further defined by far-side surface 428. Other opening shapes can be used to form cavity 420. For example, cavity 420 can be formed using a circular opening in surface 211.

Figure 5:
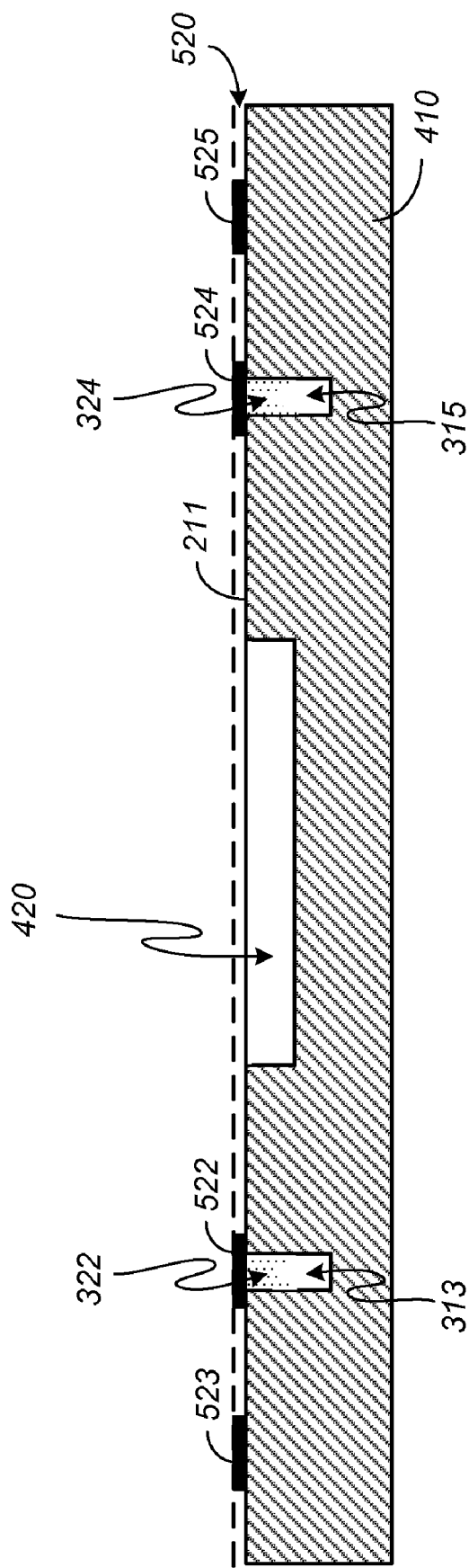
FIG. 5 is a schematic diagram illustrating an embodiment of the semiconductor substrate of FIG. 4 where a bonding layer has been applied.

FIG. 5 is a schematic diagram illustrating the semiconductor substrate 410 of FIG. 4 where a bonding layer has been applied. Bonding layer 520 is created by adding bond element 522, bond element 523, bond element 524 and bond element 525 on surface 211 of semiconductor substrate 410. As illustrated in FIG. 5, individual bond elements may or may not be aligned with enclosed volume 313 or enclosed volume 315. In the illustrated embodiment, bond element 522 is in substantial alignment, and in contact, with the fill material 322 adjacent to enclosed volume 313. Similarly, bond element 524 is in substantial alignment, and in contact, with the fill material 324 adjacent to enclosed volume 315. Bond element 523 and bond element 525 may be in contact with a circuit trace or other circuit element or may simply be located on surface 211. In some embodiments bond element 523 and bond element 525 may be separate legs of a continuous perimeter enclosure or ring (sometimes referred to as a race track) that encompasses cavity 420, bond element 522 and bond element 524. In an alternative embodiment, (not shown) a perimeter enclosure is located between cavity 420 and each of bond element 522 and bond element 524.

In some embodiments, the individual elements in the bond layer 520 are applied after the upper or first surface 211 of the substrate 410 is treated using a chemical mechanical polishing (CMP) technique such that the fill material in each of the voids is coplanar with first surface 211. Bond element 522, bond element 523, bond element 524 and bond element 525 are applied using one or more deposition and patterning techniques such as physical vapor deposition (PVD), chemical vapor deposition (CVD), plating, screen printing and other techniques. The bond layer 520 comprises bond elements made from one or more of gold, a gold-based alloy, copper, a copper-based alloy, aluminum, an aluminum-based alloy, a metal alloy such as solder having a relatively low melting temperature, among other materials.

Figure 6:
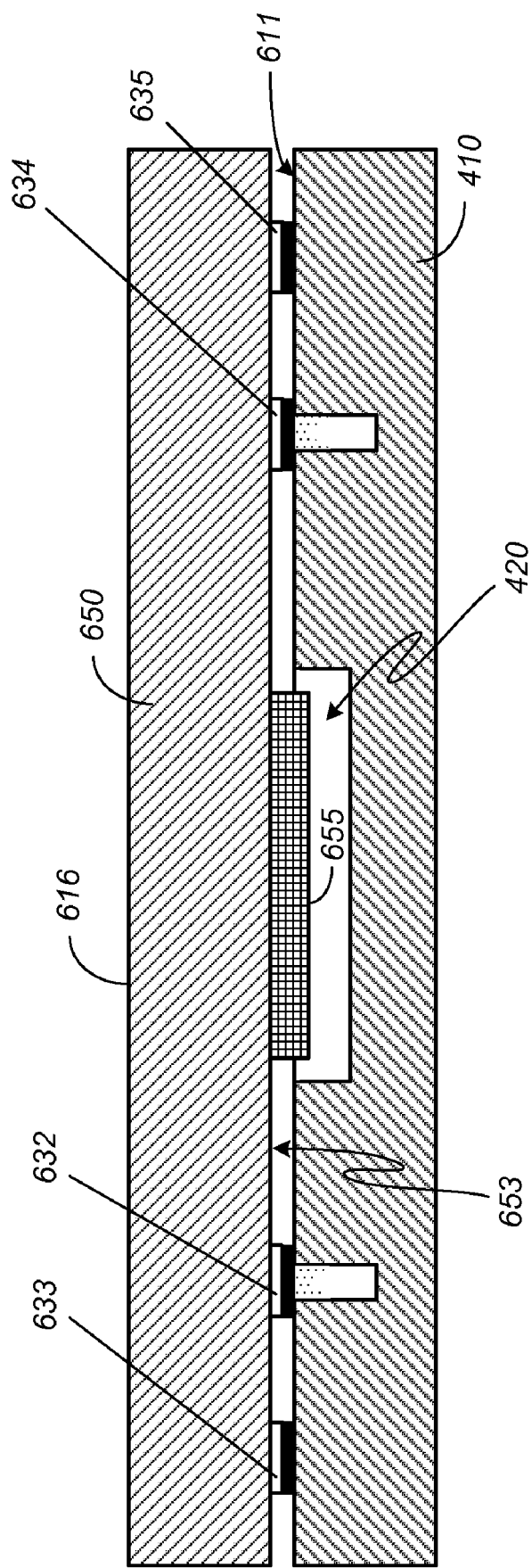
FIG. 6 is a schematic diagram illustrating an embodiment of the semiconductor substrate of FIG. 5 where a device wafer is bonded using the bonding layer.

FIG. 6 is a schematic diagram illustrating the integration of a device wafer with the semiconductor substrate 410 of FIG. 5. As indicated in FIG. 6, device wafer 650 has a first surface 616 and an opposing mounting surface 653. Semiconductor device 655 is disposed along mounting surface 653 such that semiconductor device 655 fits within cavity 420 formed in first surface 211. In the illustrated embodiment, metallization element 632 is arranged to align substantially with bond element 522; metallization element 633 is arranged to align substantially with bond element 523; metallization element 634 is arranged to align substantially with bond element 524; and metallization element 635 is arranged to align substantially with bond element 525.

One or more of metallization element 632, metallization element 633, metallization element 634 and metallization element 635 may be coupled to circuit traces and/or vias in the device wafer 650. In addition, one or more of metallization element 632, metallization element 633, metallization element 634 and metallization element 635 can be treated with a layer of solder and the device wafer 650 and semiconductor substrate 610 heated until the solder flows then cooled such that device wafer 650 and semiconductor substrate 610 are physically and perhaps electrically bonded in a three-dimensional stacked package. In some embodiments, the combination of metallization element 633 with bond element 523 and metallization element 635 with bond element 525 may form separate legs of a continuous perimeter enclosure or ring that encompasses cavity 420, semiconductor device 655, bond element 522 and bond element 524.

Figure 7:
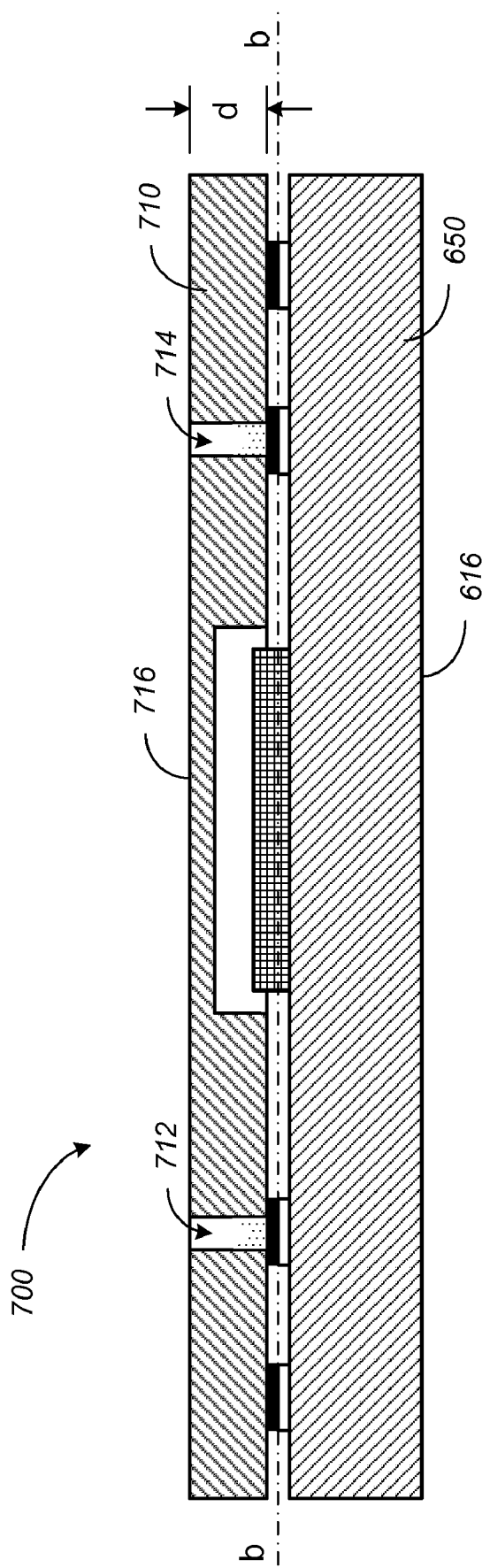
FIG. 7 is a schematic diagram illustrating an embodiment of the semiconductor substrate and device wafer assembly of FIG. 6 where the partially filled via is exposed.

FIG. 7 is a schematic diagram illustrating an embodiment of the semiconductor substrate and device wafer assembly of FIG. 6 where the partially filled vias are exposed. The semiconductor substrate and device wafer assembly illustrated in FIG. 7 is rotated 180° about a horizontal axis, b, from the assembly shown in FIG. 6. The assembly 700 is supported by surface 616 of device wafer 650, with device wafer 650 located below semiconductor substrate 710. In the illustrated embodiment, semiconductor substrate 710 has been thinned from the original thickness D (FIG. 2) to a present thickness of distance d (or less). As a result, enclosed volume 313 (FIG. 3) adjacent to fill material 312 (FIG. 3) is now exposed by opening 712 in surface 716. Similarly, enclosed volume 315 (FIG. 3) adjacent to fill material 314 (FIG. 3) is now exposed by opening 714 in surface 716.

Figure 8:
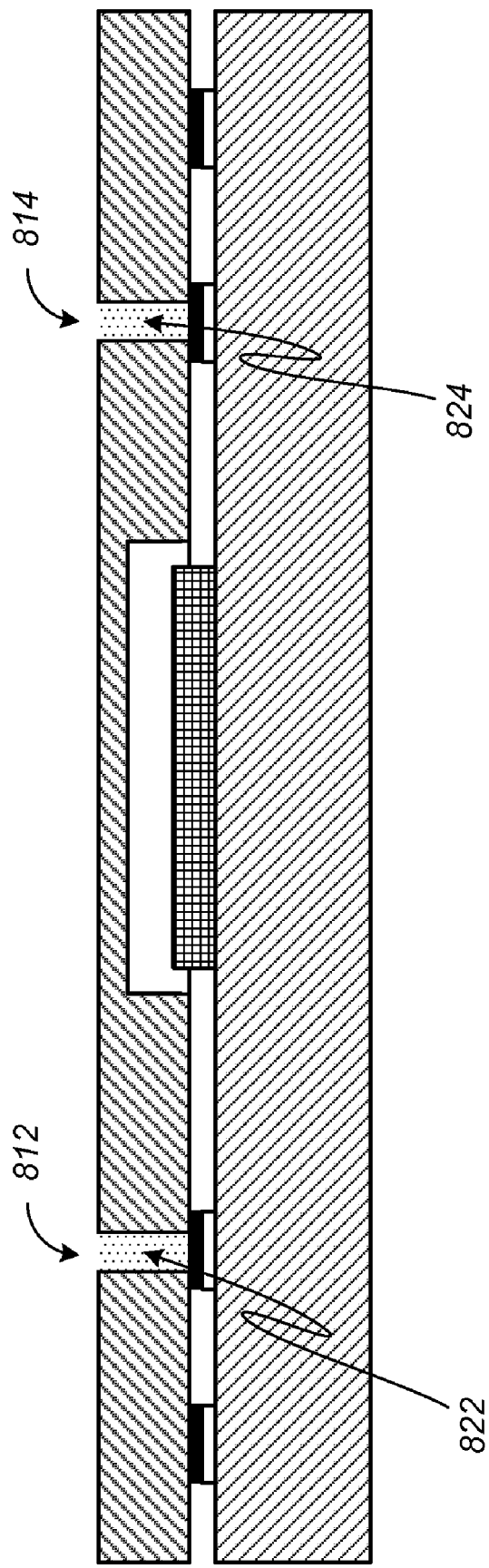
FIG. 8 is a schematic diagram illustrating an embodiment of the semiconductor substrate and device wafer assembly of FIG. 7 after the vias have been filled.

FIG. 8 is a schematic diagram illustrating an embodiment of the semiconductor substrate and device wafer assembly of FIG. 7 after the through vias have been completed. As illustrated, through via 812 and through via 814 are completely filled with fill material 822 and fill material 824. Fill material 822 and fill material 824 are electrically conductive and free of voids. Preferably, fill material 822 and fill material 824 include the same element or composition. Alternative embodiments (not shown) may include through vias that are constructed with fill materials that are different from each other. These alternative embodiments could be constructed using multiple two-stage processes to construct through vias.

The process of filling the remaining portion of the voids to complete through via 812 and through via 814, as shown in FIG. 8, can be performed with or without a seed layer. When a seed layer is desired, the seed layer may be deposited or otherwise applied to the side or vertical surfaces within the exposed volume. The seed layer (not shown) may comprise any material that accepts or accelerates the acceptance of atoms or ions of an electrically conductive material on the treated surfaces of the void. In some embodiments, the conductive material comprises one or more of copper, nickel, or solder, which are plated or applied using a plating process such as electroplating to fill the remaining portion of the void to complete the respective through via.

Figure 9:
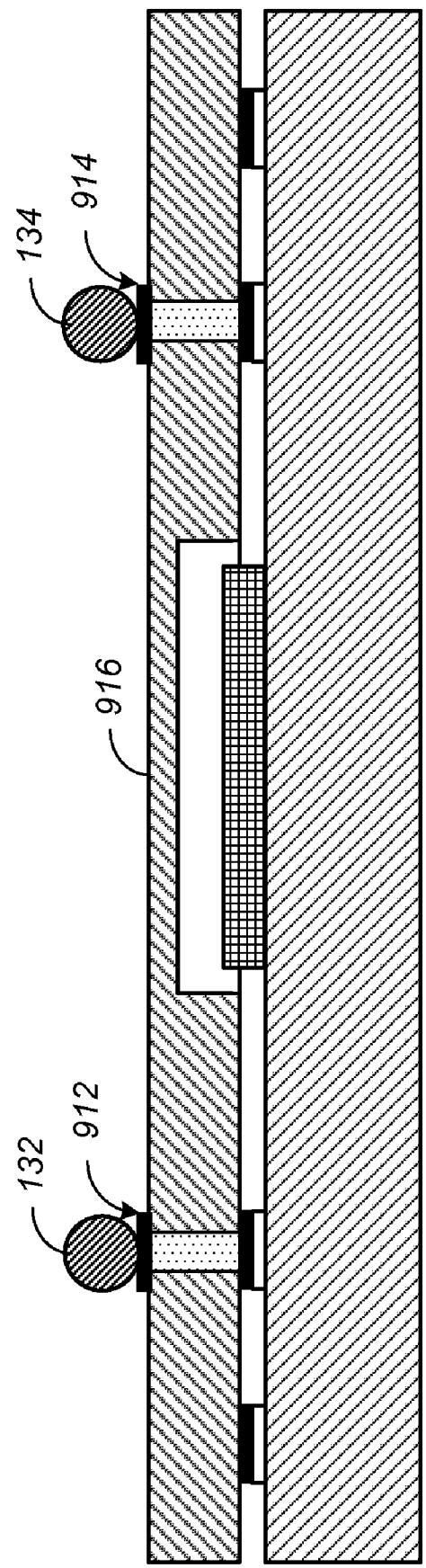
FIG. 9 is a schematic diagram illustrating an embodiment of the semiconductor substrate and device wafer assembly of FIG. 8 after metallization and application of solder bumps.

FIG. 9 is a schematic diagram illustrating a cross-sectional view of an embodiment of the semiconductor substrate and device wafer assembly of FIG. 8 after metallization and application of solder bumps. As indicated in FIG. 9, metallization element 912 is applied on surface 916 in alignment with an underlying through via. Solder bump 132 is applied on an upper surface of the metallization element 912. In addition, metallization element 914 is applied on surface 916 in alignment with a respective through via. Solder bump 134 is applied on the upper surface of metallization element 914.

Solder bumps are spheres of solder (solder balls) that are bonded to contact areas or pads (metallization elements) of semiconductor devices and that are subsequently used for bonding of corresponding devices. The length of the electrical connections between the circuits are minimized by (a) placing solder bumps on the die, (b) flipping the die over, (c) aligning the solder bumps with the contact pads on the substrate, and (d) re-flowing the solder balls in a furnace to establish the bonding between the die and the substrate. This method provides electrical connections with minute parasitic inductances and capacitances. In addition, the contact pads are distributed over the entire chip surface rather than being confined to the periphery, as in wire bonding and most tape automated bonding (TAB) technologies. As a result, the silicon area is used more efficiently, the maximum number of interconnects is increased, and signal interconnections are shortened.

Figure 10:
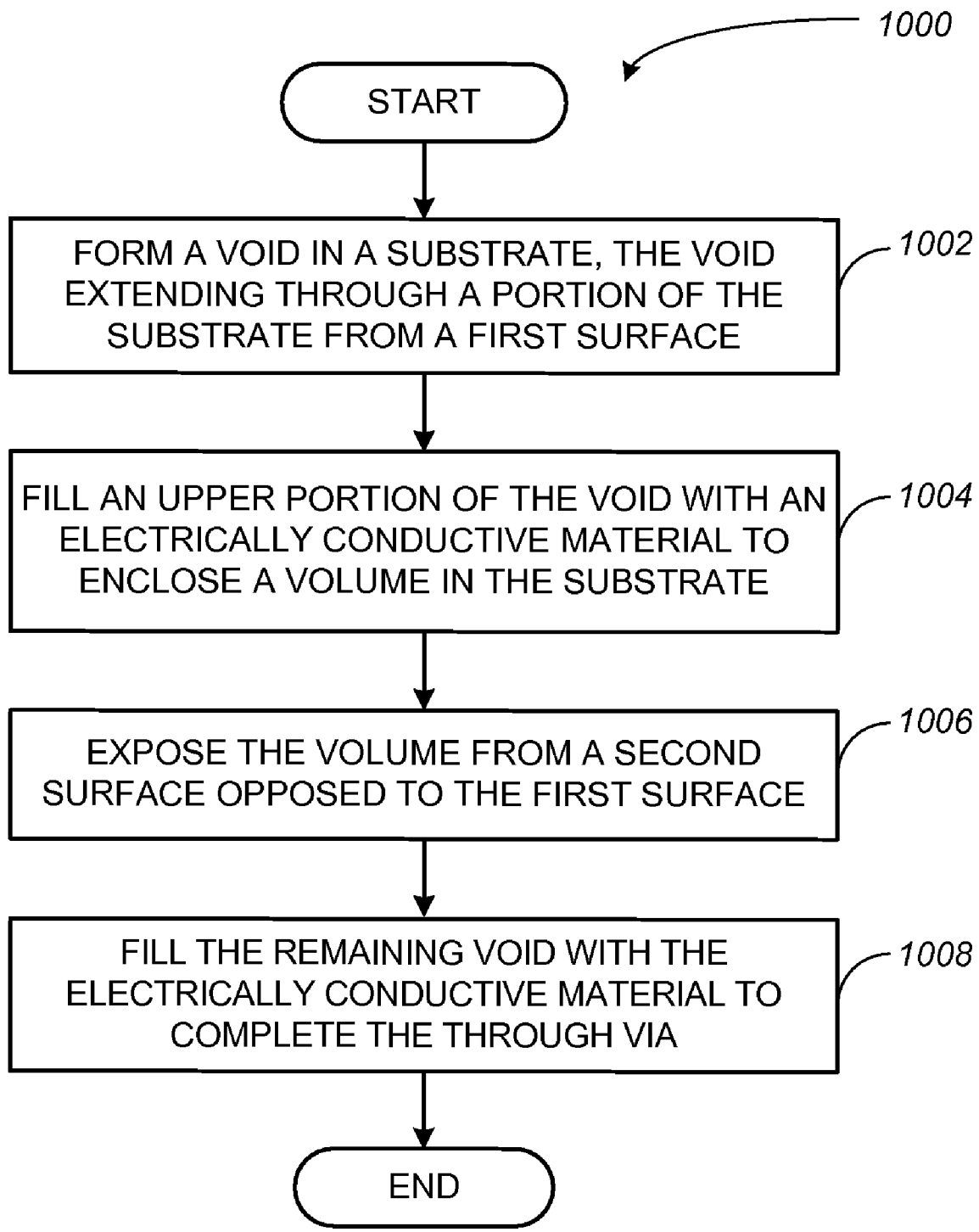
FIG. 10 is a flow chart illustrating an embodiment of a method for forming a through via.

FIG. 10 is a flow chart illustrating an embodiment of a method 1000 for filling a through via. Method 1000 begins with block 1002 where a void is formed through a portion of a semiconductor substrate. The void is formed starting from a first surface of the semiconductor substrate. The void can be formed using one or more processes such as deep reactive ion etching, reactive ion etching, and drilling. When the void is formed by a drilling procedure, a laser or micromechanical bit can be used to remove material from the substrate. It should be understood that the void can be formed by one or more known or later developed processes for removing material from a substrate.

In block 1004, the upper portion of the void is filled with a conductive material to create an enclosed volume within the semiconductor substrate. The step of filling the upper portion of the void can be performed with or without a seed layer. When a seed layer is desired, a seed layer may be deposited or otherwise applied to one or more surfaces within the void. The seed layer may comprise any material that accepts or accelerates the acceptance of atoms or ions of an electrically conductive material on the treated surfaces of the void. In some embodiments, the conductive material comprises one or more of copper, nickel, or solder, which are plated or applied using a plating process such as electroplating to fill the void partially. Electroplating is the process by which a metal in its ionic form is supplied with electrons to form a non-ionic coating on a desired substrate. The most common system involves: a chemical solution which contains the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal. Electroless plating is an alternative for electroplating to fill the voids partially. Other possible coating techniques include thin-film deposition, vapor deposition, sputter deposition, as well as methods using vacuum conditions or gas.

Next, as shown in block 1006, the previously exposed volume is exposed by removing material from the opposing side of the substrate. Material can be removed from the opposing side of the substrate using one or more of grinding, wet etching, or other known or later developed CMP techniques. Thereafter, as shown in block 1008, the remaining portion of the void is filled. The step of filling the remaining portion of the void can be performed with or without a seed layer. When a seed layer is desired, a seed layer may be deposited or otherwise applied to one or more surfaces within the void. The seed layer may comprise any material that accepts or accelerates the acceptance of atoms or ions of an electrically conductive material on the treated surfaces of the void. As with the upper or first portion of the void, the conductive material used to fill the remaining portion of the void comprises one or more of copper, nickel, or solder, which are plated or applied using a plating process such as electroplating to complete the through via.

Figure 11:
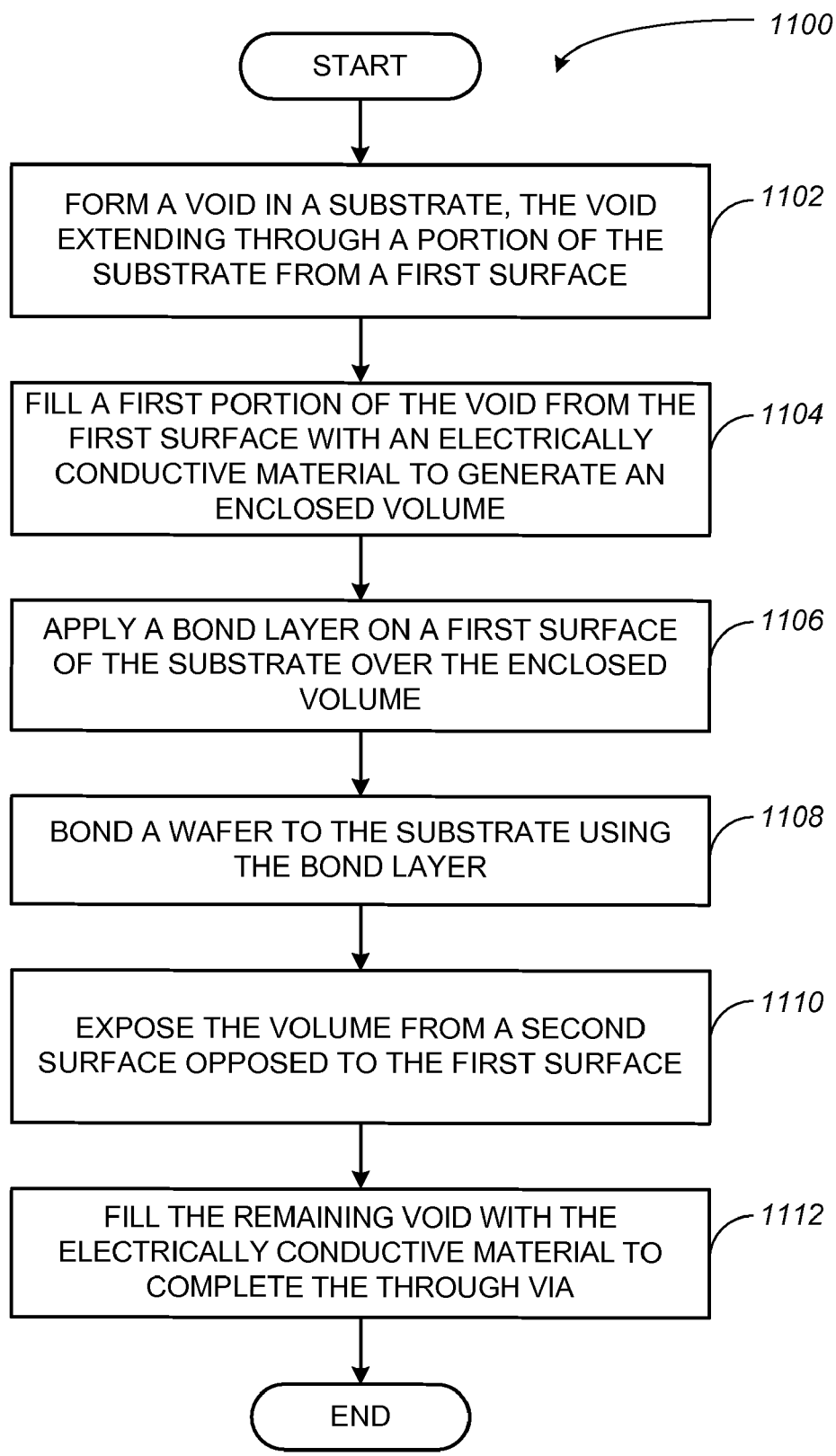
FIG. 11 is a flow chart illustrating an embodiment of a method for manufacturing a stacked assembly.

FIG. 11 is a flow chart illustrating an embodiment of a method 1100 for manufacturing a stacked composite assembly. Method 1100 begins with block 1102 where a void is formed through a portion of a semiconductor substrate. The void is formed starting from a first surface of the semiconductor substrate. The void can be formed using one or more processes such as deep reactive ion etching, reactive ion etching, and drilling. When the void is formed by a drilling procedure, a laser or micromechanical bit can be used to remove material from the substrate. It should be understood that the void can be formed by one or more known or later developed processes for removing material from a substrate.

In block 1104, the upper portion of the void is filled with a conductive material to create an enclosed volume within the semiconductor substrate. The step of filling the upper portion of the void can be performed with or without a seed layer. When a seed layer is desired, a seed layer may be deposited or otherwise applied to one or more surfaces within the void. The seed layer may comprise any material that accepts or accelerates the acceptance of atoms or ions of an electrically conductive material on the treated surfaces of the void. In some embodiments, the conductive material comprises one or more of copper, nickel, or solder, which are plated or applied using a plating process such as electroplating to fill the void partially. Electroplating is the process by which a metal in its ionic form is supplied with electrons to form a non-ionic coating on a desired substrate. The most common system involves: a chemical solution which contains the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal. Electroless plating is an alternative for electroplating to fill the voids partially. Other possible coating techniques include thin-film deposition, vapor deposition, sputter deposition, as well as methods using vacuum conditions or gas.

As shown in block 1106, a bond layer is applied on the first surface of the semiconductor over the enclosed volume. In some embodiments, the bond layer is applied after the upper or first surface of the substrate is treated via a CMP technique such that the fill material is coplanar with the first surface. In still other embodiments, the bond layer comprises bond elements that contact the material applied in block 1104, which covers the enclosed volume and additional bond elements in contact with the upper surface of the substrate. These additional bond elements may or may not be electrically coupled to circuit traces or elements on the upper or first surface of the substrate. The bond layer is applied using one or more deposition and patterning techniques such as PVD, CVD, plating and screen printing. The bond layer comprises one or more of gold, a gold-based alloy, copper, a copper-based alloy, aluminum, an aluminum-based alloy, a metal alloy such as solder having a relatively low melting temperature, among other materials.

As shown in block 1108, a wafer is bonded to the semiconductor substrate using the bond layer. This can be accomplished by aligning one or more bond elements on the upper surface of the substrate with one or more respective metallization elements present on the mounting surface of the wafer. As is known, the metallization elements may be coupled to circuit traces and/or vias in the wafer. As is also known the metallization elements can be treated with a layer of solder and the wafer and semiconductor substrate heated until the solder flows. Once the temperature surrounding the wafer and semiconductor substrate cools below the melting temperature of the solder, the wafer and the substrate are physically and perhaps electrically bonded. The semiconductor devices may be physically sealed by the one or more bond elements and metallization elements.

Next, as shown in block 1110, the previously exposed volume is exposed by removing material from the opposing side of the substrate. Material can be removed from the opposing side of the substrate using one or more of grinding, wet etching, or other known or later developed CMP techniques. Thereafter, as shown in block 1112, the remaining portion of the void is filled. The step of filling the remaining portion of the void can be performed with or without a seed layer. When a seed layer is desired, a seed layer may be deposited or otherwise applied to one or more surfaces within the void. The seed layer may comprise any material that accepts or accelerates the acceptance of atoms or ions of an electrically conductive material on the treated surfaces of the void. As with the upper or first portion of the void, the conductive material used to fill the remaining portion of the void comprises one or more of copper, nickel, or solder, which are plated or applied using a plating process such as electroplating to complete the through via.

While various embodiments of the wafer-level package and methods for forming a through via have been described, it will be apparent to those of ordinary skill in the art that many more embodiments and implementations are possible that are within the scope of this disclosure. Accordingly, the wafer-level package and methods for forming a through via are not to be restricted except in light of the attached claims and their equivalents.

What is claimed is:

1. A method for manufacturing a package, comprising:
   providing a semiconductor substrate having a first surface and a second surface opposed to the first surface;
   forming a void through a portion of the semiconductor substrate, the void extending from the first surface of the semiconductor substrate in the direction of the second surface;
   forming a recess in the first surface of the semiconductor substrate in the direction of the second surface;
   filling partially the void from a first opening in the first surface of the semiconductor substrate with a first conductive fill material to enclose the void within the semiconductor substrate;
   applying a bond layer on the first surface of the semiconductor over the first conductive fill material;
   bonding a wafer to the semiconductor substrate using the bond layer, such that a semiconductor device mounted on the wafer is received in the recess in the first surface of the semiconductor substrate;
   exposing the void by removing material from the second surface of the semiconductor substrate in the direction of the first surface; and
   filling the void from a second opening created by the exposing the void in the second surface with a second conductive fill material, wherein the filling partially the void from the first opening in the first surface and the filling the void from the second opening created by the exposing the void produce a continuously filled electrically conductive via in two filling steps.

2. The method of claim 1, wherein forming the void comprises a process selected from the group consisting of deep reactive ion etching, reactive ion etching, and drilling.

3. The method of claim 2, wherein the selected process is drilling, and the drilling comprises the use of a laser.

4. The method of claim 2, wherein the void has an opening comprising a diameter in a first range of 5 to 100 micrometers and a depth in a second range of 30 to 200 micrometers.

5. The method of claim 1, wherein one of the filling partially the void from the first opening in the first surface and the filling the void from the second opening created by the exposing the void in the second surface is performed after depositing a seed layer.

6. The method of claim 5, wherein plating comprises electroplating.

7. The method of claim 6, wherein electroplating comprises an application of copper in the void.

8. The method of claim 6, wherein electroplating comprises an application of nickel in the void.

9. The method of claim 6, wherein electroplating comprises an application of solder in the void.

10. The method of claim 1, wherein one of the filling partially the void from the first opening in the first surface and the filling the void from the second opening created by the exposing the void in the second surface comprises plating.

11. The method of claim 1, wherein one of the filling partially the void from the first opening in the first surface and the filling the void from the second opening created by the exposing the void in the second surface further comprises polishing one of the first conductive fill material and the second conductive fill material.

12. The method of claim 1, wherein exposing the void comprises a process selected from the group consisting of grinding, polishing and etching.

13. The method of claim 1, wherein one of the filling partially the void from the first opening in the first surface and the filling the void from the second opening created by the exposing the void in the second surface further comprises polishing the first surface and the first conductive fill material.

* * * * *